(12) United States Patent
Wieczorek et al.

(10) Patent No.: US 6,812,159 B2
(45) Date of Patent: Nov. 2, 2004

(54) METHOD OF FORMING A LOW LEAKAGE DIELECTRIC LAYER PROVIDING AN INCREASED CAPACITIVE COUPLING

(75) Inventors: Karsten Wieczorek, Dresden (DE); Falk Graetsch, Dresden (DE); Lutz Herrmann, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/420,635

(22) Filed: Apr. 22, 2003

(65) Prior Publication Data

US 2004/0043627 A1 Mar. 4, 2004

(30) Foreign Application Priority Data

Sep. 2, 2002 (DE) .......................................... 102 40 449

(51) Int. Cl.[7] .......................... H01L 21/31; H01L 21/469
(52) U.S. Cl. ........................ 438/778; 438/787; 438/788; 438/791; 438/792
(58) Field of Search ................................. 438/197, 216, 438/261, 287, 513, 585, 591, 761, 762, 769, 771–773, 775–778, 787, 788, 791, 792

(56) References Cited

U.S. PATENT DOCUMENTS

| | | | |
|---|---|---|---|
| 6,168,958 B1 | 1/2001 | Gardner et al. | 438/3 |
| 6,323,094 B1 | 11/2001 | Wu | 438/303 |
| 6,380,056 B1 * | 4/2002 | Shue et al. | 438/591 |
| 6,649,538 B1 * | 11/2003 | Cheng et al. | 438/775 |
| 2004/0043570 A1 * | 3/2004 | Fujisaki et al. | 438/287 |

* cited by examiner

Primary Examiner—Evan Pert
Assistant Examiner—Asok Kumar Sarkar
(74) Attorney, Agent, or Firm—Williams, Morgan & Amerson, P.C.

(57) ABSTRACT

A method of forming a dielectric layer that may be used as a dielectric separating a gate electrode from a channel region of a field effect transistor is provided which allows a high capacitive coupling while still maintaining a low leakage current level. This is achieved by introducing a dopant, for example nitrogen, that increases the resistance of the dielectric layer by means of low energy plasma irradiation, wherein an initial layer thickness is selected to substantially avoid penetration of the dopant into the underlying material. Subsequently, dielectric material is removed by an atomic layer etch to finally obtain the required design thickness.

33 Claims, 4 Drawing Sheets

METHOD OF FORMING A LOW LEAKAGE DIELECTRIC LAYER PROVIDING AN INCREASED CAPACITIVE COUPLING

BACKGROUND OF THE INVENTION

1. Field of the Invention

Generally, the present invention relates to the field of fabricating microstructures, such as integrated circuits, micromechanical structures and the like, and, more particularly, to the formation of an ultra-thin dielectric layer having increased resistance against migration of charge carriers through the dielectric layer.

2. Description of the Related Art

Presently, microstructures are integrated into a wide variety of products. One example in this respect is the employment of integrated circuits that, due to their relatively low cost and high performance, are increasingly used in many types of devices, thereby allowing superior control and operation of those devices. Due to economic reasons, manufacturers of microstructures, such as integrated circuits, are confronted with the task of steadily improving performance of these microstructures with every new generation appearing on the market. However, these economic constraints not only require improving the device performance but also demand a reduction in size so as to provide more functionality of the integrated circuit per unit chip area. Thus, in the semiconductor industry, ongoing efforts are being made to reduce the feature sizes of feature elements. In present day technologies, the critical dimensions of these elements approach 0.1 $\mu$m and less. In producing circuit elements of this order of magnitude, process engineers are, along with many other issues especially arising from the reduction of feature sizes, faced with the task of providing extremely thin dielectric layers on an underlying material layer, wherein certain characteristics of the dielectric layer, such as permittivity and/or resistance against charge carrier tunneling and the like, have to be improved without sacrificing the physical properties of the underlying material layer.

One important example in this respect is the formation of ultra-thin gate insulation layers of field effect transistors, such as MOS transistors. The gate dielectric of a transistor has an impact on the performance of the transistor. As is commonly known, reducing the size of a field effect transistor, that is reducing the length of a conductive channel that forms in a portion of a semiconductor region by applying a control voltage to a gate electrode formed on the gate insulation layer, also requires the reduction of the thickness of the gate insulation layer to maintain the required capacitive coupling from the gate electrode to the channel region. Currently, most of the highly sophisticated integrated circuits, such as CPUs, memory chips and the like, are based on silicon and, therefore, silicon dioxide has preferably been used as the material for the gate insulation layer due to the well-known and superior characteristics of the silicon dioxide/silicon interface. For a channel length on the order of 100 nm and less, however, the thickness of the gate insulation layer has to be reduced to about 2 nm in order to maintain the required controllability of the transistor operation. Steadily decreasing the thickness of the silicon dioxide gate insulation layer, however, leads to an increased leakage current therethrough, thereby resulting in an unacceptable increase of static power consumption as the leakage current exponentially increases for a linear reduction of the layer thickness.

Therefore, great efforts are presently being made to replace silicon dioxide by a dielectric exhibiting a significantly higher permittivity so that a thickness thereof may be remarkably higher than the thickness of a corresponding silicon dioxide layer providing the same capacitive coupling. A thickness for obtaining a specified capacitive coupling will also be referred to as capacitive equivalent thickness and determines the thickness that would be required for a silicon dioxide layer. It turns out, however, that it is difficult to incorporate high-k materials into the conventional integration process and, more importantly, the provision of a high-k material as a gate insulation layer seems to have a significant influence on the carrier mobility in the underlying channel region, thereby remarkably reducing the carrier mobility and thus the drive current capability. Hence, although an improvement of the static transistor characteristics may be obtained by providing a thick high-k material, at the same time an unacceptable degradation of the dynamic behavior presently makes this approach less than desirable.

A different approach that is currently favored is the employment of an integrated silicon oxide/nitride layer stack that may reduce the gate leakage current by 0.5–2.0 orders of magnitude while maintaining compatibility with standard CMOS process techniques. It has been found that the reduction of the gate leakage current mainly depends upon the nitrogen concentration incorporated into the silicon dioxide layer by means of plasma nitridation. Although this approach seems to relax the issue of gate dielectric leakage for the present circuit generation, this approach does not seem to allow further aggressive dielectric thickness scaling required for future device generations. In addition, this solution may be difficult to be designed so as to be compatible with sophisticated CMOS processes. To more clearly demonstrate the problems involved in the conventional process technique, a typical process flow for forming a gate insulation layer, including a silicon dioxide/nitride layer, will now be described with reference to FIGS. 1a–1e.

In FIG. 1a, a semiconductor device 100 comprises a silicon substrate 101, in which an active region 103 is defined by shallow trench isolations 102. A thin dielectric base layer 110, for example formed of a grown oxide layer, covers the active region 103. Moreover, the semiconductor device 100 is exposed to a nitrogen-containing plasma indicated by reference sign 104.

Typically, the semiconductor device 100 may be formed according to the following process sequence. After formation of the shallow trench isolations 102 and various implantation steps to generate a required well dopant profile (not shown) in the active region 103, the dielectric base layer 110 is formed by a conventional oxidation process or by a rapid thermal oxidation process. Subsequently, the semiconductor device 100 is exposed to the nitrogen-containing plasma 104 to introduce nitrogen ions into the silicon dioxide layer 110 to improve, as explained above, the resistance of the dielectric base layer 110 against charge carrier migration. An energy of the ions in the nitrogen-containing plasma 104 is substantially determined by the difference between the plasma potential and the floating potential of the semiconductor device 100, wherein this voltage is difficult to adjust or may not be adjustable at all.

As is well known, nitrogen atoms, introduced into the active region 103 and, thus, into the channel region of the transistor device to be formed, significantly affect the electrical characteristics of the transistor device in that both the crystallinity of the active region 103 is deteriorated and the charge carrier mobility is degraded. Consequently, the introduction of nitrogen into the active region 103 has to be suppressed as much as possible in view of a required high transistor performance. On the other hand, a thickness of the dielectric base layer 110 is to be scaled down in conformity with the device dimensions which would, however, at a certain minimum dielectric thickness, lead to an increased penetration of nitrogen ions into the active region 103 during the plasma treating 104. As a consequence, there exists a severe trade-off between the improvement of the transistor device performance by scaling down the dielectric base layer 110 and the device degradation caused by the incorporation of nitrogen into the active region 103. FIGS. 1b–1c will more clearly illustrate this situation.

In FIG. 1b, on the left-hand side, a cut-out of FIG. 1a is schematically illustrated in a magnified view, in which the dielectric base layer 110 includes nitrogen atoms in a concentration profile 112 along a depth direction 111. As is evident from FIG. 1b, a thickness 113 of the dielectric base layer 110 is selected so that a penetration of nitrogen into the underlying active region 103 may be substantially avoided. The right-hand side of FIG. 1b depicts a graph, wherein the concentration profile 112 is plotted versus the depth direction 111. As can be seen from this graph, the nitrogen concentration drops to a very low value, which in the present illustration is idealized as zero, within the thickness 113 of the base layer 110, thereby substantially avoiding any device degradation caused by the reduction of carrier mobility. The situation illustrated in FIG. 1b represents the design thickness 113 in conformity with a desired channel length, which suffices to still allow a substantial blocking of the nitrogen.

FIG. 1c, on the other hand, illustrates the situation when a thickness 113' of the base layer 110 has to be reduced in conformity with design rules compared to that of FIG. 1b and, therefore, the concentration profile 112 reaches down into the active area 103 as the plasma conditions may be difficult to control to determine or limit the penetration depths of the nitrogen. The right-hand side of FIG. 1c shows a resulting nitrogen concentration 112 with respect to the depth direction 111 and clearly reveals that a significant amount of nitrogen is in the active region 103, to thereby negatively affect the carrier mobility.

FIG. 1d schematically shows the semiconductor device 100 in an advanced manufacturing stage. Drain and source regions 107 are formed within the active region 103 and a gate electrode 106 is formed on the patterned dielectric base layer 110, which is now indicated as 110a, wherein the gate insulation layer 110a has the thickness 113 and a nitrogen concentration profile 112, as shown in FIG. 1b. Moreover, sidewall spacers 105 are formed adjacent to the gate electrode 106.

Typical process steps for forming the semiconductor device 100, as shown in FIG. 1d, include well-known advanced photolithography and etch techniques as well as implantation steps and, thus, a detailed description thereof will be omitted.

FIG. 1e, on the other hand, schematically depicts the semiconductor device 100 having the gate insulation layer 110a with the reduced thickness 113' as shown in FIG. 1c so that a corresponding residual nitrogen concentration is present within the drain and source regions 107 and the relevant portion of the active region 103.

As a consequence, the prior art processing described above allows a sealing of the thickness 113 of the gate insulation layer 110a to a value that substantially prevents penetration of nitrogen into the active region 103, thereby obtaining improved device performance. However, when design requirements demand a further scaling of the thickness 113 to conform to the corresponding transistor dimensions, i.e., when the design capacitive equivalent thickness requires the thickness 113', an unacceptable amount of nitrogen is introduced into the surface portion of the active region 103 so that the reduced carrier mobility may result in a device performance degradation.

In view of the above problems, it has been suggested to correspondingly lower the potential of the nitrogen-containing plasma 104 so as to generally reduce the penetration depth of the nitrogen ions. It appears, however, that reducing the potential is limited to a certain minimal value for fundamental considerations. It is, therefore, that the situation described above still maintains even for a minimum plasma potential.

In view of the problems explained above, it is, thus, highly desirable to provide a technique allowing improvement of the resistance of a dielectric layer against migration of charge carriers without unduly negatively affecting the physical characteristics of an underlying material layer, such as the carrier mobility of a silicon layer.

SUMMARY OF THE INVENTION

Generally, the present invention is directed to a technique that allows the provision of a dielectric layer having a specified capacitance equivalent thickness, wherein the physical characteristics of an underlying material layer are substantially not affected. A dielectric base layer is formed on the underlying material layer and a required resistance against the passage of charged particles is adjusted by introducing an appropriate concentration of a dielectric dopant, wherein a thickness of the dielectric base layer is selected so as to substantially avoid penetration of the dielectric dopant into the underlying material. By a controlled and slow removal of the doped dielectric base layer, the final thickness thereof is adjusted to the desired capacitance equivalent thickness.

According to one illustrative embodiment of the present invention, a method of forming a dielectric layer on a semiconductor region comprises forming a dielectric base layer having a first predefined thickness and introducing a dielectric dopant into the base layer to increase a resistance against charge carrier migration through the base layer. The first thickness is then reduced to obtain a final thickness that substantially corresponds to a desired design value. In one embodiment, this reduction may be accomplished by an atomic layer etch process.

According to a further illustrative embodiment of the present invention, a method of forming a dielectric layer on a silicon-containing semiconductor region comprises forming a dielectric layer with a first thickness on the silicon-containing semiconductor region and introducing nitrogen into the dielectric layer. Next, a rapid thermal anneal process is carried out in an oxidizing ambient and, subsequently, the first thickness of the dielectric layer is reduced to obtain a final thickness of the dielectric layer corresponding to the predefined capacitance equivalent thickness.

In accordance with still another illustrative embodiment of the present invention, a method of forming a gate insulation layer having a predefined capacitance equivalent thickness comprises providing a substrate including a semiconductor region and a doped dielectric layer formed on the semiconductor region, wherein the dielectric layer has a first thickness. Moreover, the dopants in the dielectric layer are distributed by a rapid thermal anneal process and subsequently material from the doped dielectric layer is removed to obtain a second thickness that substantially corresponds to the predefined capacitance equivalent thickness.

BRIEF DESCRIPTION OF THE DRAWINGS

The invention may be understood by reference to the following description taken in conjunction with the accompanying drawings, in which like reference numerals identify like elements, and in which.

Figure 1A:
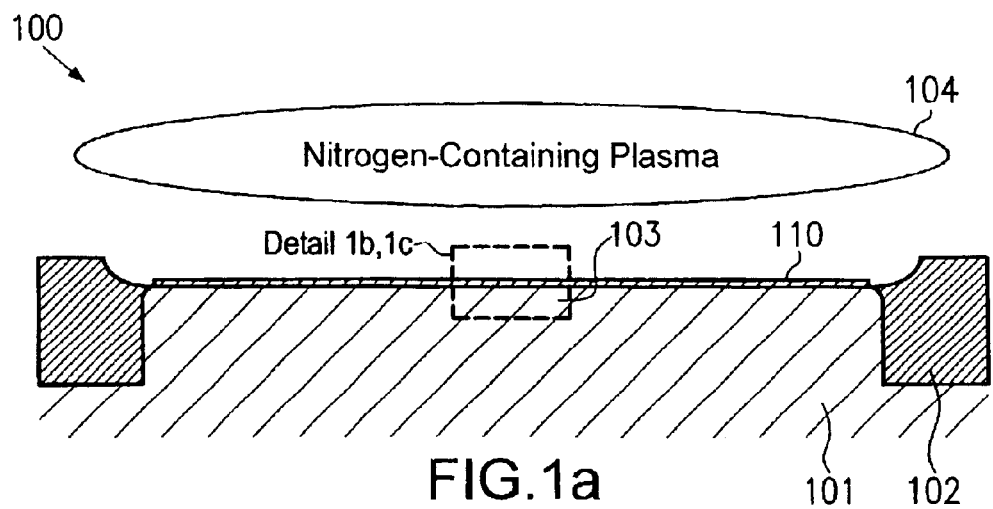
FIGS. 1a–1e schematically show a semiconductor device during various process steps for forming an ultra-thin gate insulation layer in accordance with a typical prior art process flow.
Figure 1B:
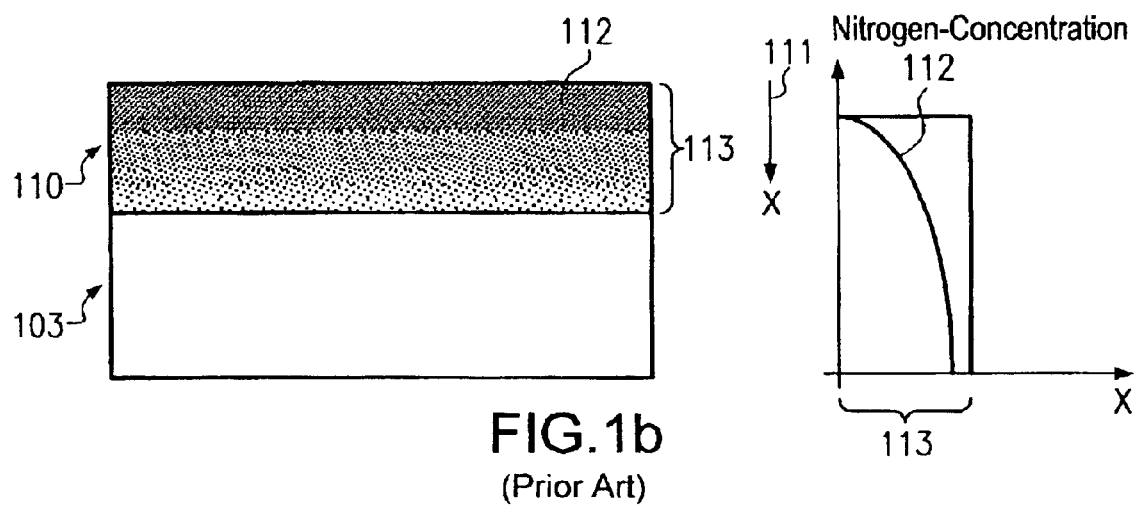

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In the following illustrative embodiments, reference will be made to the formation of a gate dielectric layer of a field effect transistor. The application of the principles of the present invention for ultra-thin low leakage highly capacitive gate dielectrics should, however, not be considered as limiting. Rather, the formation of ultra-thin dielectric layers are or may become relevant in a plurality of applications, such as the dielectric of capacitors, as are frequently used as decoupling capacitors in CMOS devices, in opto-electronic micro-structures, such as surface emitting laser elements, in micro-mechanical structures, in the field of nanotechnology, and the like.

Figure 2A:
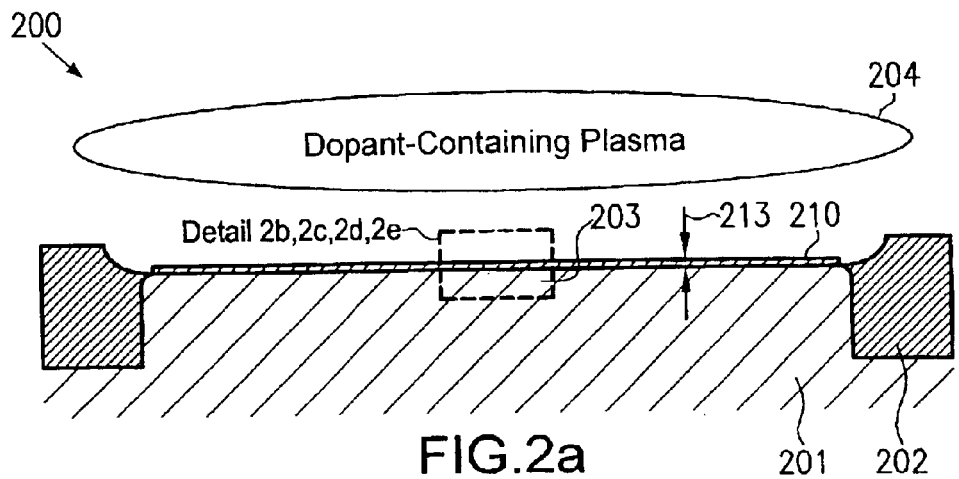
FIGS. 2a–2f schematically show manufacturing steps in accordance with illustrative embodiments of the present invention.

In FIG. 2a, a semiconductor device 200 comprises a substrate 201 having formed thereon an active semiconductor region 203 that may additionally comprise a specified dopant distribution to provide the required transistor characteristics for the field effect transistor to be formed thereabove. Since the present invention is especially advantageous when applied to silicon-based CMOS processes, the substrate 201 may be considered as any appropriate substrate for carrying a silicon-containing layer that substantially comprises the active region 203. It should, however, be appreciated that the active region 203 may comprise other materials, for example germanium or other materials, required for adjusting the desired physical characteristics of the active region 203. In semiconductor devices based on semiconductive materials other than silicon, the active region 203 may be comprised of various materials, such as III–V or II–VI semiconductors and the like. The active region 203 is enclosed by an isolation structure 202, such as a shallow trench isolation usually employed in highly sophisticated semiconductor devices. A dielectric base layer 210 is formed on the active region 203 with a first thickness 213 that is deliberately chosen to substantially avoid penetration of dopants through the dielectric base layer 210 into the underlying active region 203 during exposure to a plasma ambient 204 containing a specified dopant.

In one particular embodiment, the dielectric base layer is substantially comprised of silicon dioxide and the active region 203 comprises silicon. In other embodiments, the dielectric base layer 210 may be comprised of an oxide of an underlying semiconductive material. In one embodiment, the thickness 213 is in the range of approximately 1–10 nm. The plasma ambient 204 containing a dielectric dopant, which is, in one particular embodiment, nitrogen, is established with process parameters that allow the introduction of the dopant at a relatively low energy, yet establishing a continuous increase of dopant concentration within the dielectric base layer 210. In one embodiment, the plasma ambient 204 comprises nitrogen and the potential of the plasma ambient 204 with respect to a reference potential is maintained within a range of approximately 10–50 volts.

Figure 1C:
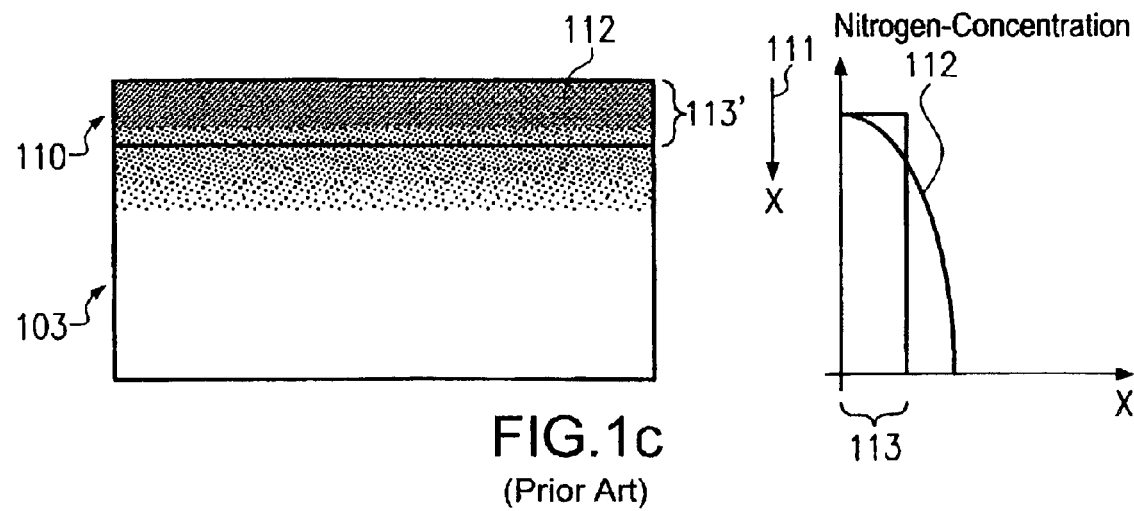
Figure 1D:
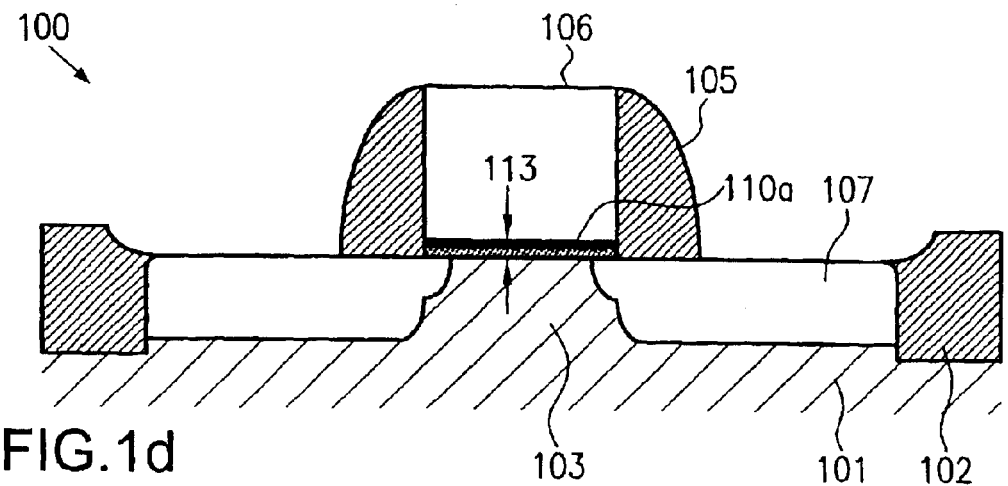
Figure 1E:
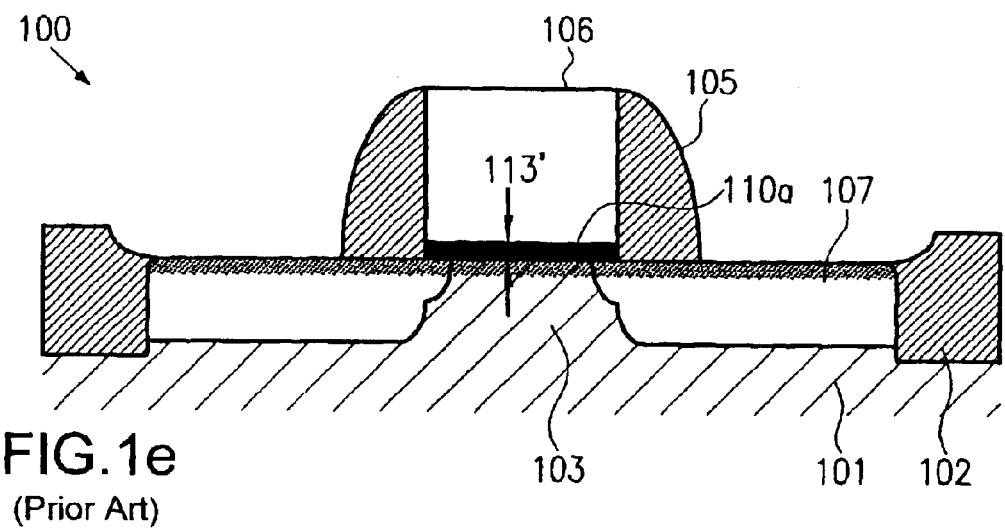

Regarding the formation of the semiconductor device 200 as shown in FIG. 2a, substantially the same process steps as already described with reference to FIG. 1a may be employed. In particular, the dielectric base layer 210, when comprised of a semiconductor oxide or silicon dioxide, may be formed by conventional growth processes, such as a high temperature furnace growth or by a rapid thermal oxidation process. In other embodiments, the dielectric base layer 210 may be deposited using sophisticated deposition methods, such as chemical vapor deposition of atomic monolayers and the like. Contrary to the prior art processing, especially as shown in FIG. 1c, the first thickness 213 is selected in conformity with the potential of the plasma ambient 204 to substantially avoid any penetration of dopants into the active region 203. For example, by performing one or more test runs, a dependency between the plasma settings, especially the plasma potential, and the penetration depth of the dopant may be determined such that a maximum tolerable dopant penetration into the active region 203 may not be exceeded.

Figure 2B:
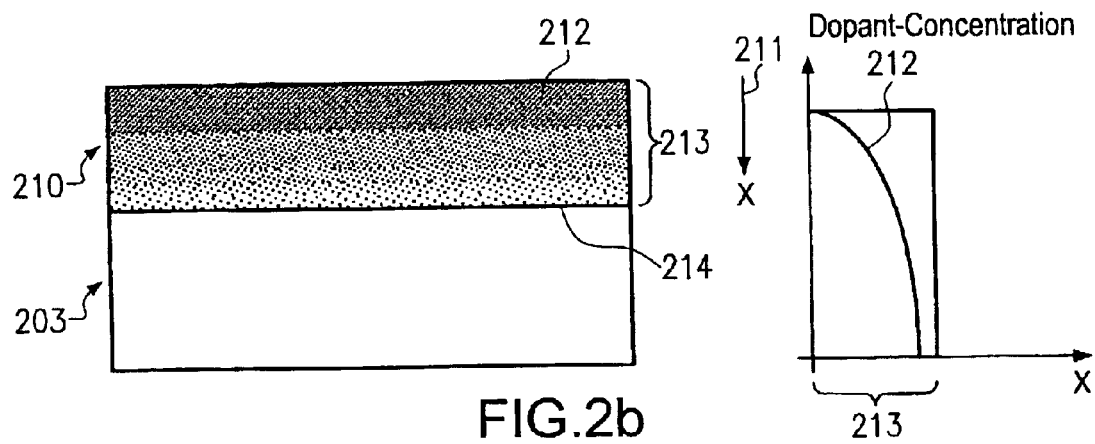

FIG. 2b schematically shows, on the left side, the cut-out depicted in FIG. 2a in a magnified illustration after the introduction of dopants into the dielectric base layer 210 is completed. The dielectric base layer 210 includes a dopant concentration profile 212 along a depth direction 211 that gradually decreases towards an interface 214 between the dielectric base layer 210 and the active region 203. The right-hand side of FIG. 2b schematically shows a graph representing the dopant concentration profile 212 with respect to the depth direction 211, wherein an ideal situation is illustrated, in which no dopant atoms have penetrated into the active region 203. It should be appreciated, however, that minute amounts of dopants may reach the interface 214 or may even pass into the active region 203 as long as the maximum tolerable concentration is not exceeded. Preferably, the thickness 213 and/or the plasma ambient parameters are selected such that substantially no dopant atoms will be introduced into the active region 203.

Subsequently, the substrate 201 is subjected to a heat treatment, such as a rapid thermal anneal process, to more uniformly distribute the dopant atoms throughout substantially the entire thickness 213 of the dielectric base layer 210. The process parameters, such as temperature and duration of the heat treatment, are selected such that an undue diffusion of dopants into the active region 203 is avoided. For example, by carrying out a rapid thermal anneal process with a temperature in the range of approximately 600–1000° C. with a duration of approximately 15–120 seconds, the dopants, such as nitrogen atoms, will remain substantially localized within the dielectric base layer 210 while nevertheless being distributed more uniformly with respect to the depth direction 211.

Figure 2C:
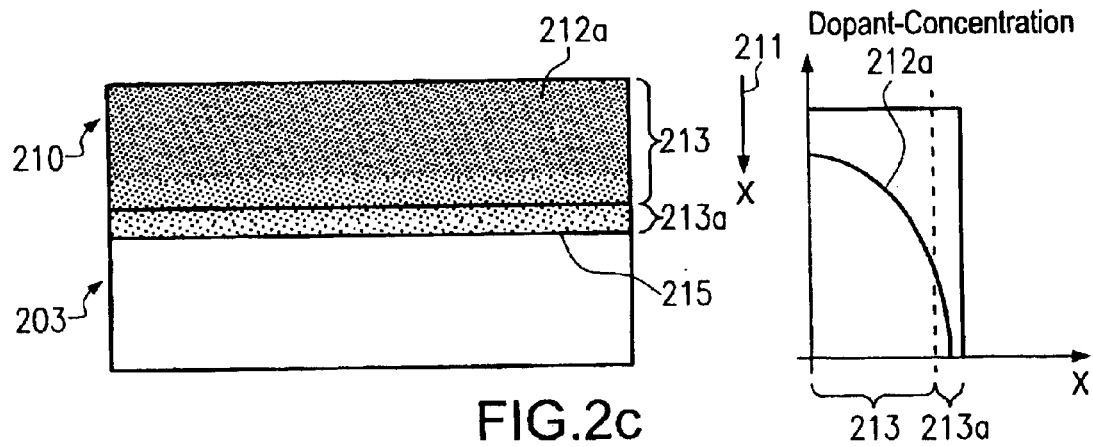

In one particular embodiment, the heat treatment is carried out in an oxidizing ambient so that a very thin oxide layer 215 is formed at the interface 214, as is depicted in FIG. 2c. FIG. 2c schematically depicts the semiconductor structure 200 after completion of the heat treatment in an oxidizing ambient. The dopant concentration 212 of FIG. 2b is changed into a more uniform distribution 212a and an additional oxide layer 215 having a thickness 213a is formed. The thickness 213a depends on the process parameters of the heat treatment, such as temperature, duration and oxygen concentration. Typically, the oxide layer 215 may be comprised of one or two atomic layers for the above-identified process parameters. The graph at the right-hand side of FIG. 2c illustrates the dopant concentration 212a along the depth direction 211, wherein, at least over a large portion of the depth 213 of the initial dielectric base layer 210, a significantly more uniform distribution is obtained compared to the initial profile 212 shown in FIG. 2b.

Figure 2D:
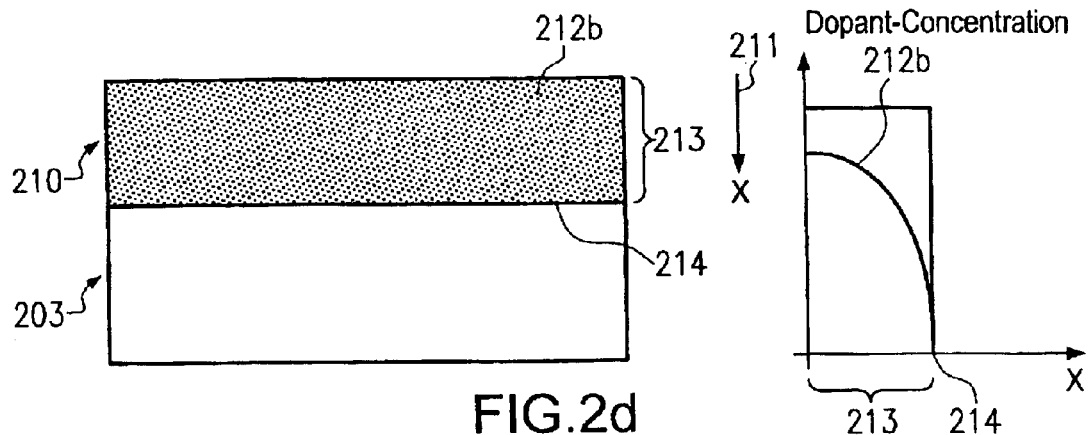

FIG. 2d schematically shows the semiconductor device 200 after completion of the heat treatment according to a further illustrative embodiment of the present invention. Differently from the heat treatment described with reference to FIG. 2c, the heat treatment is now performed in a substantially inert atmosphere, or, in another embodiment, in a nitrogen atmosphere, so that the thickness 213 of the dielectric base layer 210 is maintained. As is evident from FIG. 2d, due to the heat treatment, the dopants are redistributed to form a dopant profile 212b that is more evenly distributed over the thickness 213. The right-hand side of FIG. 2d shows the corresponding graph for the dopant concentration 212b.

Figure 2E:
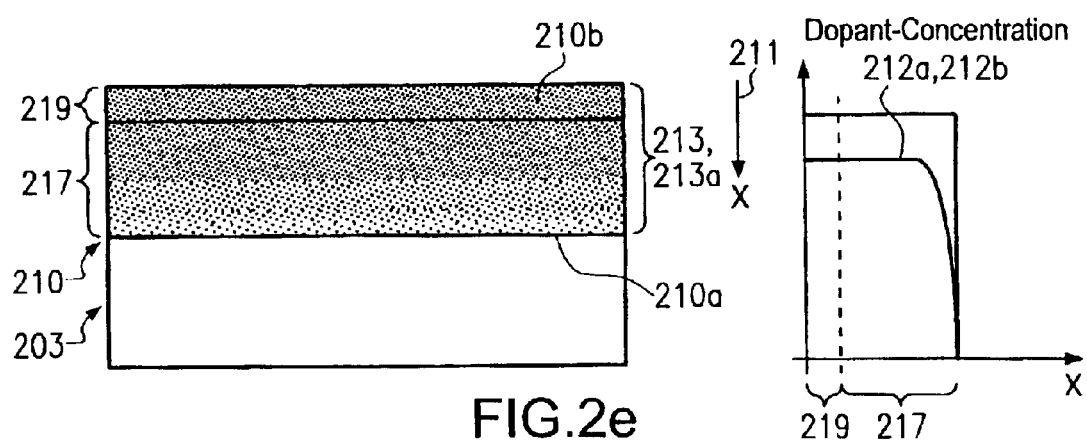

FIG. 2e shows a magnified view of the semiconductor device 200, wherein the dielectric base layer 210 is depicted as being virtually divided in a first portion 210a having a thickness 217 that substantially corresponds to a required capacitance equivalent thickness of the semiconductor device 200 and an excess portion 210b having a thickness 219 to be removed. The thickness 219 of the excess portion 210b is chosen depending on the initial thickness 213 and on the specifics of the heat treatment, as described with reference to FIGS. 2c–2d. For instance, if the embodiment described in FIG. 2c is employed, the additional thickness 213a has to be taken into account in determining the thickness 219 of the excess portion 210b to be removed.

The right-hand side of FIG. 2e illustrates the dopant concentration, indicated as 212a, 212b depending on the heat treatment applied (i.e., with or without oxide formation), with respect to the depth direction 211. It should be borne in mind that the introduction of dopants into the initial dielectric base layer 210, such as nitrogen, may also have an influence on the resulting permittivity of the portion 210a so that this change may be taken into account when determining the capacitance equivalent thickness required. For example, if nitrogen is introduced into the dielectric base layer 210 as the dopant, the permittivity thereof may be increased and the effective thickness 217 may advantageously be larger than the desired capacitance equivalent thickness. After determining the thickness 217, the excess portion 210b is removed by an etch process that allows extremely low etch rates. Appropriate etch rates may be within the range of approximately ⅕ to ½ of a monolayer, i.e., an atomic layer, per minute. Corresponding etch techniques, which are also referred to as atomic layer etch, typically require a multi-step etch process, for example, including the adsorption of a reactant, such as chloride, to the surface of the excess portion 210b, evacuation to remove excess reactant, an ion irradiation, for example with argon ions, and a further evacuation to remove any by-products. In this way, the excess portion 210b may be removed in a well-controllable and reproducible fashion. Consequently, the required ultimate thickness 217 may be obtained in correspondence to a required design capacitance equivalent thickness without unduly introducing dopant atoms, such as nitrogen, into the underlying active region 203.

Figure 2F:
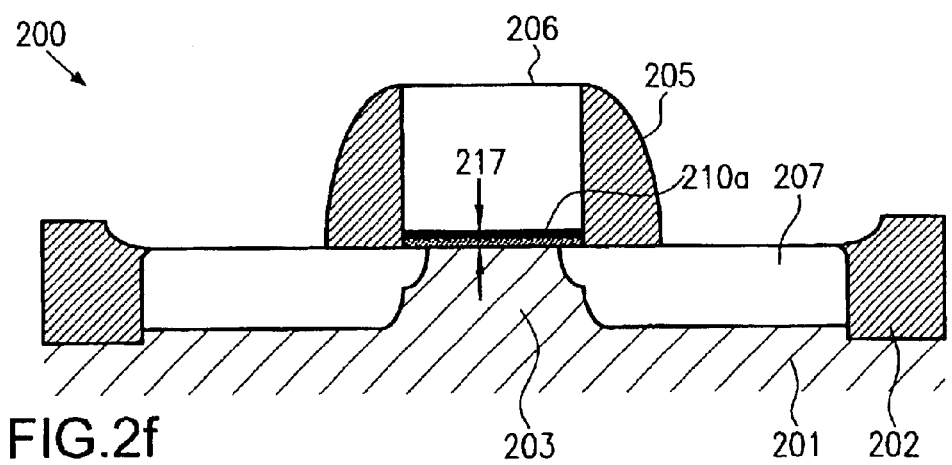

FIG. 2f schematically shows the semiconductor device 200 in a further advanced manufacturing stage. In the active region 203, source and drain regions 207 are formed. A gate electrode 206 is formed on the structured portion 210a of the dielectric base layer having the required thickness 217 in conformity with design requirements. Sidewall spacers 205 are formed adjacent to the gate electrode 206. Regarding the formation of the semiconductor device 200 as shown in FIG. 2f, well-known conventional process techniques may be used, since the present invention is advantageously substantially compatible with sophisticated CMOS technology. The semiconductor device 200, representing a field effect transistor, exhibits a low leakage gate insulation layer formed of the portion 210a, wherein the thickness 217 thereof is scalable in accordance with design requirements without deteriorating a carrier mobility in the active region 203 by undesired dopants.

In the illustrative embodiments described above, a heat treatment, for example in the form of a rapid thermal anneal process, is used to obtain a more uniform distribution of the dopants introduced into the dielectric base layer 210. In other embodiments, however, the dopant concentration, after plasma-induced introduction, may suffice to provide for the required low leakage behavior of the final portion 210a. Thus, in these embodiments, the heat treatment may be omitted and a corresponding redistribution of the dopants may take place in subsequent rapid thermal anneal cycles, such as typically used for the formation of the drain and source regions 207. Thus, a further out-diffusion of the dopants, such as the nitrogen, from the portion 210a during the further processing may be reduced by omitting the heat treatment after the plasma-induced introduction of the dopants.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a dielectric layer on a semiconductor region, the method comprising:
   forming a dielectric base layer having a first predefined thickness;
   introducing a dielectric dopant into said base layer to increase a resistance against charge carrier migration through said base layer; and
   reducing said first thickness to obtain a final thickness that substantially corresponds to a desired design value.

2. The method of claim 1, wherein reducing said first thickness is performed by an atomic layer etch.

3. The method of claim 1, wherein introducing a dielectric dopant includes exposing said substrate to a dopant-containing plasma ambient.

4. The method of claim 3, wherein a bias potential of said dopant-containing plasma ambient is selected on the basis of said first predefined thickness.

5. The method of claim 3, wherein said first predefined thickness is selected on the basis of a preselected bias potential of said dopant-containing plasma ambient.

6. The method of claim 1, wherein said first thickness is selected to substantially avoid penetration of the dopants into the semiconductor region during introduction of the dielectric dopant into said base layer.

7. The method of claim 1, further comprising performing a heat treatment for redistributing the dopants within said dielectric base layer.

8. The method of claim 7, wherein said heat treatment comprises a rapid thermal anneal process.

9. The method of claim 7, wherein said heat treatment is carried out in an inert atmosphere.

10. The method of claim 1, wherein said dielectric base layer comprises an oxide formed of semiconductor material included in said semiconductor region.

11. The method of claim 10, further comprising performing said heat treatment in an oxidizing ambient.

12. The method of claim 1, wherein an etch rate is in the range of approximately ⅕ to ½ of an atomic layer per minute.

13. The method of claim 1, wherein said semiconductor region comprises silicon and said dielectric base layer comprises silicon dioxide.

14. The method of claim 1, wherein said dielectric dopant is nitrogen.

15. The method of claim 1, further comprising forming a gate electrode structure above said dielectric base layer after said thickness of said base layer is reduced.

16. A method of forming a dielectric layer on a silicon-containing semiconductor region, the method comprising:
   forming a dielectric layer having a first thickness on said silicon-containing semiconductor region;
   introducing a dopant into said dielectric layer;
   performing a rapid thermal anneal process in an oxidizing ambient; and
   reducing said first thickness of said dielectric layer to a final thickness that substantially corresponds to said predefined capacitance equivalent thickness.

17. The method of claim 16, wherein introducing a dopant into said dielectric layer includes exposing said dielectric layer to a dopant-containing plasma ambient.

18. The method of claim 17, wherein a bias potential of said plasma ambient is selected on the basis of said first thickness.

19. The method of claim 17, wherein said first thickness is selected on the basis of a preselected bias potential of said dopant-containing plasma ambient.

20. The method of claim 16, wherein said first thickness is selected to substantially avoid penetration of the dopants into said semiconductor region during introduction of the dopant into said dielectric layer.

21. The method of claim 16, further comprising performing a heat treatment for redistributing the dopants within said dielectric layer.

22. The method of claim 21, wherein said heat treatment comprises a rapid thermal anneal process.

23. The method of claim 21, wherein said heat treatment is carried out in an inert atmosphere.

24. The method of claim 16, wherein said dielectric layer comprises an oxide formed of semiconductor material included in said semiconductor region.

25. The method of claim 24, further comprising a heat treatment in an oxidizing ambient.

26. The method of claim 16, wherein a removal rate is in the range of approximately ⅕ to ½ of an atomic layer per minute.

27. The method of claim 16, wherein said semiconductor region comprises silicon and said dielectric layer comprises silicon dioxide.

28. The method of claim 16, wherein said dielectric dopant is nitrogen.

29. The method of claim 16, further comprising forming a gate electrode structure above said dielectric layer after said thickness of said dielectric layer is reduced.

30. A method of forming a gate insulation layer having a predefined capacitance equivalent thickness, the method comprising:
   providing a substrate including a semiconductor region with a doped dielectric layer formed on said semiconductor region, said doped dielectric layer having a first thickness;
   redistributing dopants in said doped dielectric layer by a rapid thermal anneal process; and
   removing material from said doped dielectric layer by an atomic layer etch to obtain a second thickness that substantially corresponds to said capacitance equivalent thickness.

31. The method of claim 30, wherein providing said substrate includes:
   forming a semiconductor oxide layer on said semiconductor region by at least one of oxidation and deposition; and
   introducing dopants into said dielectric layer by exposing said dielectric layer to a plasma ambient including said dopants.

32. The method of claim 31, wherein said first thickness is adjusted in accordance with a preselected bias potential of said plasma ambient.

33. The method of claim 30, wherein a bias potential of the plasma ambient is selected on the basis of said first thickness.

* * * * *